US009320139B2

(12) United States Patent
Lee (10) Patent No.: US 9,320,139 B2
(45) Date of Patent: Apr. 19, 2016

(54) CIRCUIT BOARD HAVING INTERIOR SPACE

(71) Applicant: BOARDTEK ELECTRONICS CORPORATION, Taoyuan County (TW)

(72) Inventor: Chien-Cheng Lee, Taoyuan County (TW)

(73) Assignee: BOARDTEK ELECTRONICS CORPORATION, Taoyuan County (TW)

( * ) Notice: Subject to any disclaimer, the term of this patent is extended or adjusted under 35 U.S.C. 154(b) by 101 days.

(21) Appl. No.: 14/299,017

(22) Filed: Jun. 9, 2014

(65) Prior Publication Data

US 2015/0359087 A1    Dec. 10, 2015

(51) Int. Cl.
*H05K 1/00*     (2006.01)
*H05K 1/02*     (2006.01)
*H05K 1/03*     (2006.01)

(52) U.S. Cl.
CPC ............ *H05K 1/0284* (2013.01); *H05K 1/0326* (2013.01); *H05K 2201/0195* (2013.01); *H05K 2201/10424* (2013.01)

(58) Field of Classification Search
CPC .......... H05K 7/10; H01L 21/02; H01L 21/48; H01L 21/56; H01L 21/60; H01L 21/67; H01L 21/68; H01L 23/24; H01L 23/28; H01L 23/31; H01L 23/34; H01L 23/48; H01L 23/52

USPC .......... 174/254; 257/667, 700, 706, 707, 758; 381/174; 349/38, 85
See application file for complete search history.

(56) References Cited

U.S. PATENT DOCUMENTS

| 5,625,222 | A  | * | 4/1997  | Yoneda et al. ................. 257/687 |
| 5,652,463 | A  | * | 7/1997  | Weber et al. .................. 257/706 |
| 6,607,396 | B1 | * | 8/2003  | Ito ................................. 439/331 |
| 6,906,849 | B1 | * | 6/2005  | Mi et al. ........................ 359/291 |
| 2002/0008804 | A1 | * | 1/2002 | Ogawa et al. ................... 349/58 |
| 2005/0161823 | A1 | * | 7/2005 | Jobetto et al. ................ 257/758 |
| 2008/0044043 | A1 | * | 2/2008 | Yonehara et al. ............. 381/174 |
| 2008/0136995 | A1 | * | 6/2008 | Oohira ........................... 349/58 |
| 2012/0321111 | A1 | * | 12/2012 | Lillelund ...................... 381/174 |

* cited by examiner

*Primary Examiner* — Xiaoliang Chen
(74) *Attorney, Agent, or Firm* — Li & Cai Intellectual Property (USA) Office (57) ABSTRACT

A circuit board having an interior space includes a multi-layer structure and a compartmentalized frame embedded in the multi-layer structure. The multi-layer structure has a plurality of plates stacked along a stacking direction and a gel combining any two adjacent plates. The plates include two outer plates and at least one inner plate arranged between the outer plates. The compartmentalized frame defines a predetermined space. The compartmentalized frame is arranged between the outer plates and substantially abuts the outer plates. The compartmentalized frame is arranged in a path of a flowing direction of gel which flows toward the predetermined space to prevent any gel from flowing into the predetermined space. Thus, the circuit board of the instant disclosure is provided with the interior space accurately formed by embedding the compartmentalized frame.

12 Claims, 9 Drawing Sheets

CIRCUIT BOARD HAVING INTERIOR SPACE

BACKGROUND OF THE DISCLOSURE

1. Field of the Disclosure

The instant disclosure relates to a circuit board; more particular, to a circuit board having interior space.

2. Description of Related Art

The conventional circuit board usually needs to be provided with a specific interior space, so that a plurality of holes are formed in the inner plates of the conventional circuit board to define the specific interior space.

However, when the inner plates are laminated to form one part of the conventional circuit board, the gel used for combining the plates tends to flow toward the holes of the inner plates, such that the actual interior space of the conventional circuit board is different from the specific interior space. Thus, the interior space of the conventional circuit board can't be accurately controlled to achieve high precision requests To achieve the abovementioned improvement, the inventors strive through industrial experience and academic research to present the instant disclosure, which can provide additional improvement as mentioned above.

SUMMARY OF THE DISCLOSURE

One embodiment of the instant disclosure provides a circuit board configured with an interior space, and the interior space is accurately formed by embedding a compartmentalized frame.

The circuit board having interior space of the instant disclosure comprises: a multi-layer structure having a plurality of plates stacked along a stacking direction and a gel combining any two stacked plates, in which the plates includes at least two outer plates and at least one inner plate arranged between the outer plates; and a compartmentalized frame defining a predetermined space and embedded in the multi-layer structure, wherein the compartmentalized frame is arranged between the outer plates and substantially abuts the outer plates, and wherein the compartmentalized frame is arranged in a path defined by the gel flowing direction toward the predetermined space.

Base on the above, the circuit board of the instant disclosure is provided with the compartmentalized frame embedded in the multi-layer structure and arranged in the path defined by the gel flowing direction toward the predetermined space, so that when the gel arranged between any two plates flows along the corresponding plate, the flowing gel is obstructed by the compartmentalized frame. Thus, the gel cannot flow into the predetermined space of the compartmentalized frame and provide precise control spacing in the interior space of the circuit board.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
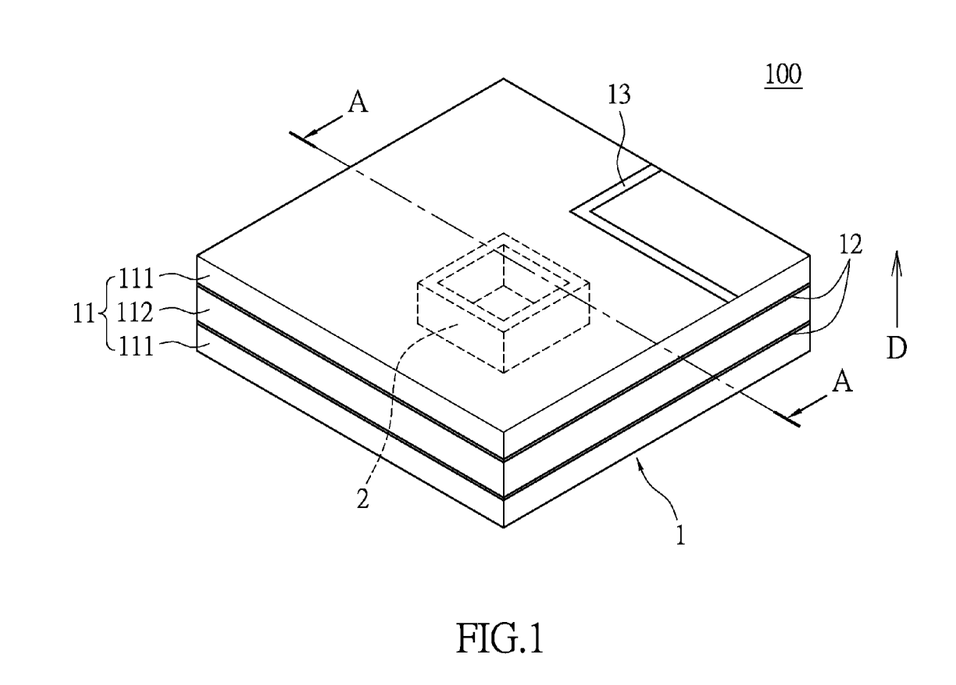
FIG. 1 is a perspective view showing a circuit board having the interior space according to the instant disclosure.

Please refer to FIG. 1, which shows an embodiment of the instant disclosure. The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

The instant embodiment provides a circuit board 100 having an interior space includes a multi-layer structure 1 and a compartmentalized frame 2 embedded in the multi-layer structure 1. The multi-layer structure 1 in the instant embodiment takes a laminated panel for example, and the instant embodiment takes one compartmentalized frame 2 for explaining, but construction of the multi-layer structure 1 and the number of the compartmentalized frame 2 are not limited thereto. The following description discloses the construction of the multi-layer structure 1 and the construction of the compartmentalized frame 2 firstly.

Please refer to FIGS. 1 through 3A. The multi-layer structure 1 has a plurality of plates 11 stacked along a stacking direction D and a gel 12 combining any two stacked plates 11. At least one of the plates 11 of the multi-layer structure 1 is provided with at least one conductive circuit 13 for transmitting signal.

Figure 3A:
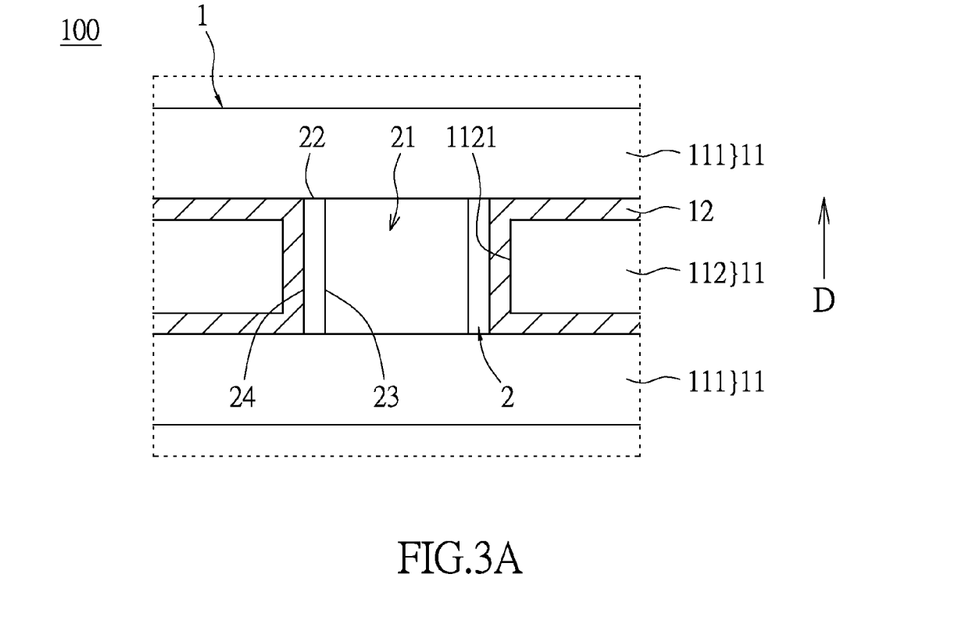
FIG. 3A is a cross-sectional view of FIG. 1 along line A-A.

The plate 11 is usually formed by a pre-impregnated material, and the pre-impregnated material can be a glass fiber pre-preg, a carbon fiber pre-preg, an epoxy resin, and so on according to the strength requested. Moreover, the plate 11 can be formed by a soft material, that is to say, the plate 11 is formed by Polyester (PET) or Polyimide (PI) without glass fiber or carbon fiber, but the plate 11 is not limited to the examples provided hereto.

Specifically, the plates 11 in the instant embodiment take two outer plates 111 and at least one inner plate 112 arranged between the outer plates 111 for example. The inner plate 112 has a wall 1121 defining a thru-hole, and the space surrounded by the wall 1121 is provided for receiving the compartmentalized frame 2. That is to say, the wall 1121 conforms to the compartmentalized frame 2.

Moreover, based on the designer's demand, the inner plate 112 is formed with a predetermined thru-hole before the laminated process of the multi-layer structure 1, and the forming manner of the thru-hole of the inner plate 112 can be a non-chemical etching manner (e.g., laser drilling, plasma etching, or milling). In more detail, the surface of the inner plate 112 can be ablated by laser drilling to form the thru-hole; or the surface of the inner plate 112 is processed by milling to form the thru-hole. Besides, the thru-hole of the inner plate 112 can be formed by milling firstly to remove part of the inner plate 112, and then processing the inner plate 112 by laser drilling.

It should be noted that the outer plate 111 and the inner plate 112 are named according to the relative position thereof. Thus, the outer plate 111 may be not the most outer plate 11 of the multi-layer structure 1 when the number of the plates 11 of the multi-layer structure 1 is more than three. Moreover, the outer plate 111 of the multi-layer structure 1 may be not the outer plate of the circuit board 100.

The compartmentalized frame 2 surroundingly defines a predetermined space 21. The compartmentalized frame 2 is arranged between the outer plates 111 and substantially abuts the outer plates 111. The compartmentalized frame 2 is substantially received in the wall 1121 of the inner plate 112 and is arranged in a path P, and the path P is defined by the gel 12 flowing direction toward the predetermined space 21.

Thus, when the gel 12 arranged between any two adjacent plates 11 flows along the corresponding plate 11 (e.g., the flowing of the gel 12 caused by the laminated process of the multi-layer structure 1), the flowing gel 12 is obstructed by the compartmentalized frame 2, so that the gel 12 cannot flow into the predetermined space 21 of the compartmentalized frame 2. Moreover, a height of the compartmentalized frame 2 along the stacking direction D is substantially identical to a combined total height of the inner plate 112 and the gel 12 along the stacking direction D.

Specifically, the compartmentalized frame 2 has two end surfaces 22 (i.e., the top surface and the bottom surface of the compartmentalized frame 2 as shown in FIG. 3A), an inner surface 23, and an outer surface 24. The end surfaces 22 are respectively and flatly abuts the outer plates 111, the inner surface 23 defines the predetermined space 21, and a gap is defined between the outer surface 23 of the compartmentalized frame 2 and the wall 1121 of the inner plate 112. The flowing gel 12 is obstructed by the compartmentalized frame 2, so that the gel 12 flows into the gap. Thus, the gap is filled with the gel 12 and enhances the connection of the compartmentalized frame 2 and the multi-layer structure 1.

Additionally, the construction of the compartmentalized frame 2 can be changed according to designer's demand, and the above description of the compartmentalized frame 2 explains the common basic features, but the compartmentalized frame 2 is not limited thereto. The following description takes some possible constructions of the compartmentalized frame 2 for example.

Figure 4:
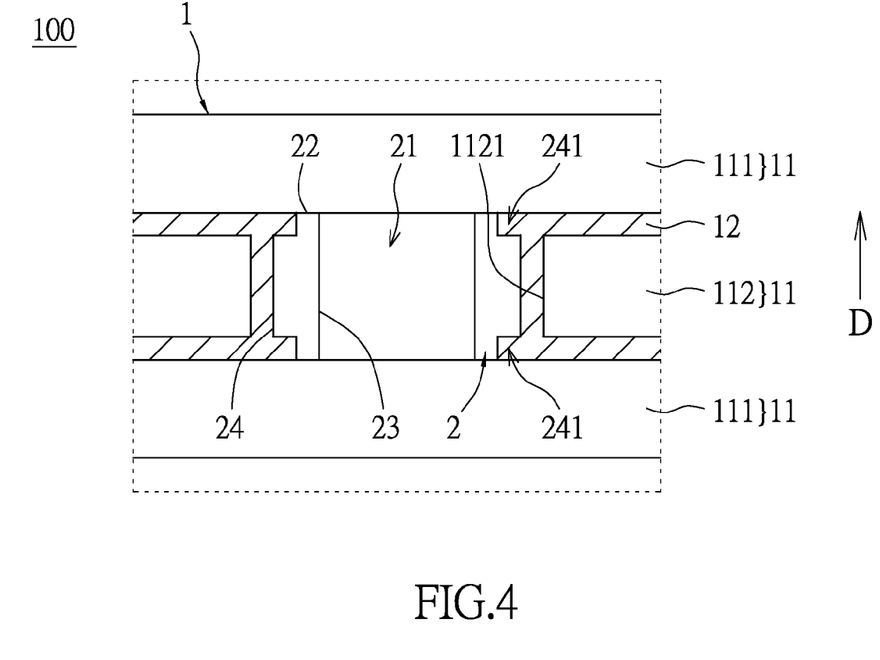
FIG. 4 is a cross-sectional view showing another embodiment of the circuit board according to the instant disclosure.

Please refer to FIGS. 1 through 3A. The compartmentalized frame 2 is substantially a tube having a rectangular cross-section or a square cross-section. That is to say, the cross-section of the compartmentalized frame 2 perpendicular to the stacking direction D is ring-shaped, the end surfaces 22 are substantially perpendicular to the stacking direction D, and the inner surface 23 and the outer surface 24 are substantially parallel to the stacking direction D. The compartmentalized frame 2 as shown in FIG. 3A can be changed as shown in FIG. 4. In more detail, each portion of the outer surface 24 of the compartmentalized frame 2 adjacent to the outer plates 111 has a cutaway corner 241, and the cutaway corners 241 of the compartmentalized frame 2 are substantially arranged in the path P, which is defined by the gel 12 flowing direction toward the predetermined space 21.

Thus, when the gel 12 arranged between any two plates 11 flows along the corresponding plate 11 (e.g., the flowing of the gel 12 caused by the laminated process of the multi-layer structure 1), the flowing gel 12 is obstructed by the cutaway corners 241 of the compartmentalized frame 2, so that the gel 12 cannot flow into the predetermined space 21 of the compartmentalized frame 2.

Figure 3B:
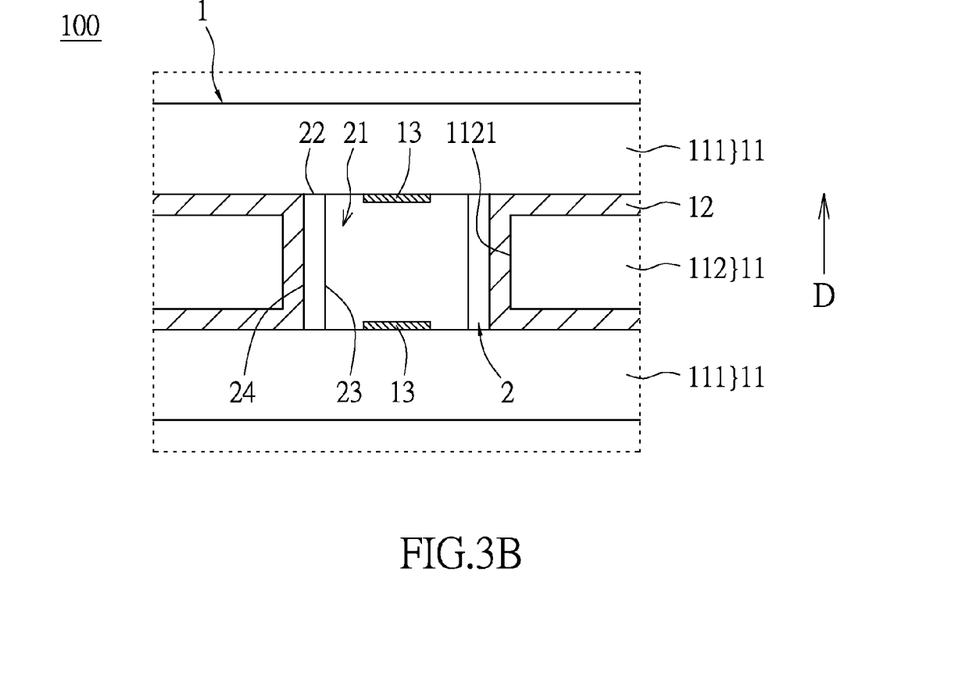
FIG. 3B is a cross-sectional view of FIG. 1 with the conductive circuit.

Moreover, in order to read the specification with ease and reference occasionally to the figures, the outer plates 111 and the inner plate 112 in FIG. 3A do not show the conductive circuit, but the multi-layer structure 1 is not limited to FIG. 3A. That is to say, the outer plates 111 and the inner plate 112 can be provided with conductive circuit according to designer's request. For example, as shown in FIG. 3B, the conductive circuit 13 is formed on the inner surface of each outer plate 111, and the conductive circuits 13 are arranged in the predetermined space 21.

Figure 5A:
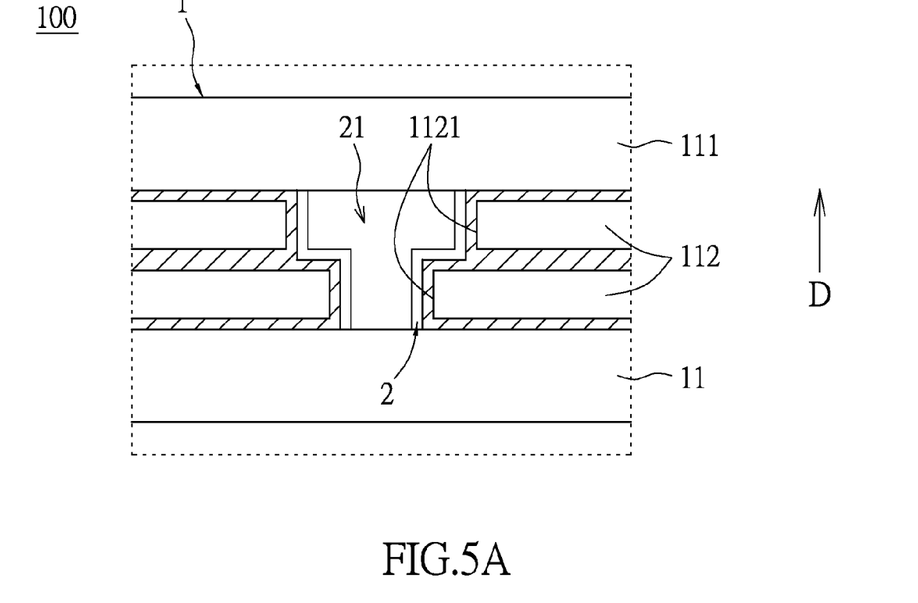
FIG. 5A is a cross-sectional view showing yet another embodiment of the circuit board according to the instant disclosure.

Additionally, the compartmentalized frame 2 of the instant embodiment can be embedded in the multi-layer structure 1 having a plurality of inner plates 112. As shown in FIG. 5A, the construction of the compartmentalized frame 2 can be formed according to the predetermined space 21 requested by the designer. When a width of the compartmentalized frame 2 along a direction perpendicular to the stacking direction D is provided with two different values (i.e., a width of the upper portion of the compartmentalized frame 2 is wider than a width of the lower portion as shown in FIG. 5A), the walls 1121 of the inner plates 112 respectively conform to the different widths of the compartmentalized frame 2. The inner plates 112 are stacked for receiving the compartmentalized frame 2, such that the compartmentalized frame 2 can be embedded in the multi-layer structure 1 firmly.

Figure 5B:
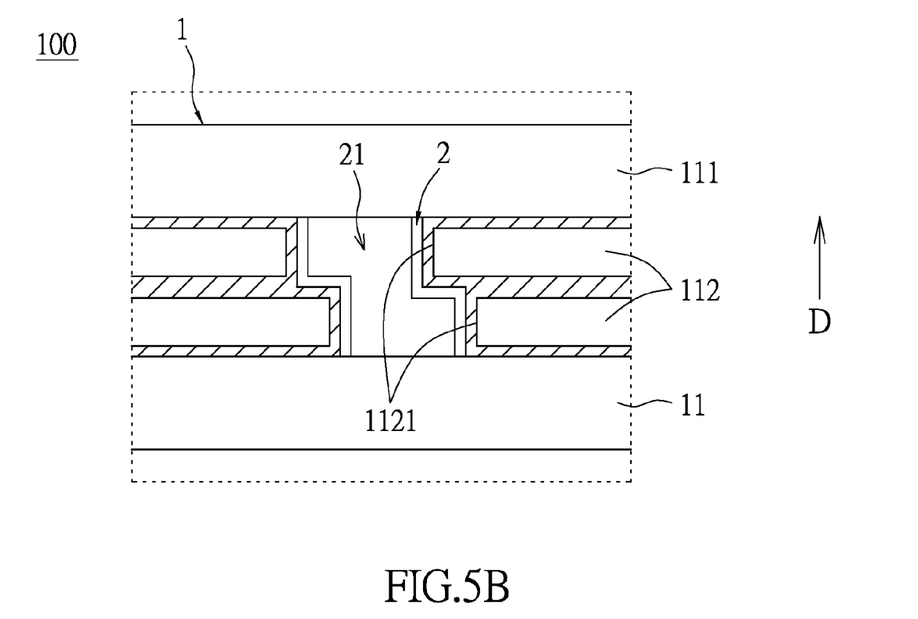
FIG. 5B is a cross-sectional view showing further still another embodiment of the circuit board according to the instant disclosure.

Alternatively, as shown in FIG. 5B, when the inner plates 112 are in a transversely staggered arrangement (i.e., transversely means a direction perpendicular to the stacking direction D), the walls 1121 of the inner plates 112 also conform to the compartmentalized frame 2, such that the compartmentalized frame 2 can be embedded in the multi-layer structure 1 firmly in preparation for the predetermined space 21.

Additionally, the outer plates 111 of the circuit board 100 can be stacked with another plate (not shown). That is to say, the circuit board 100 of the instant embodiment can be applied to another circuit board (not shown) by the conventional lay-up process. The lay-up process is a conventional feature, so the instant embodiment does not further state the lay-up process.

Figure 2:
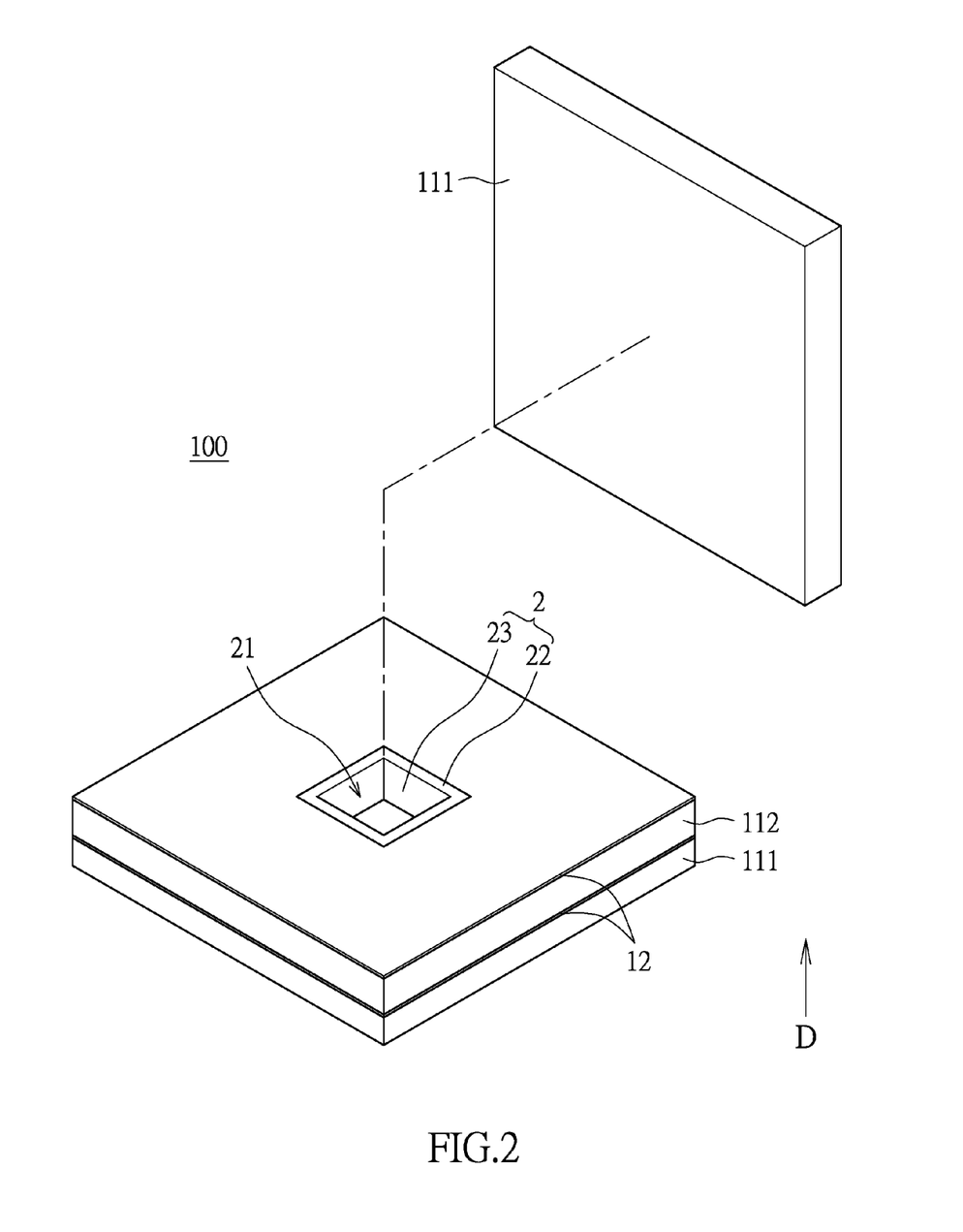
FIG. 2 is an exploded view of FIG. 1.
Figure 6:
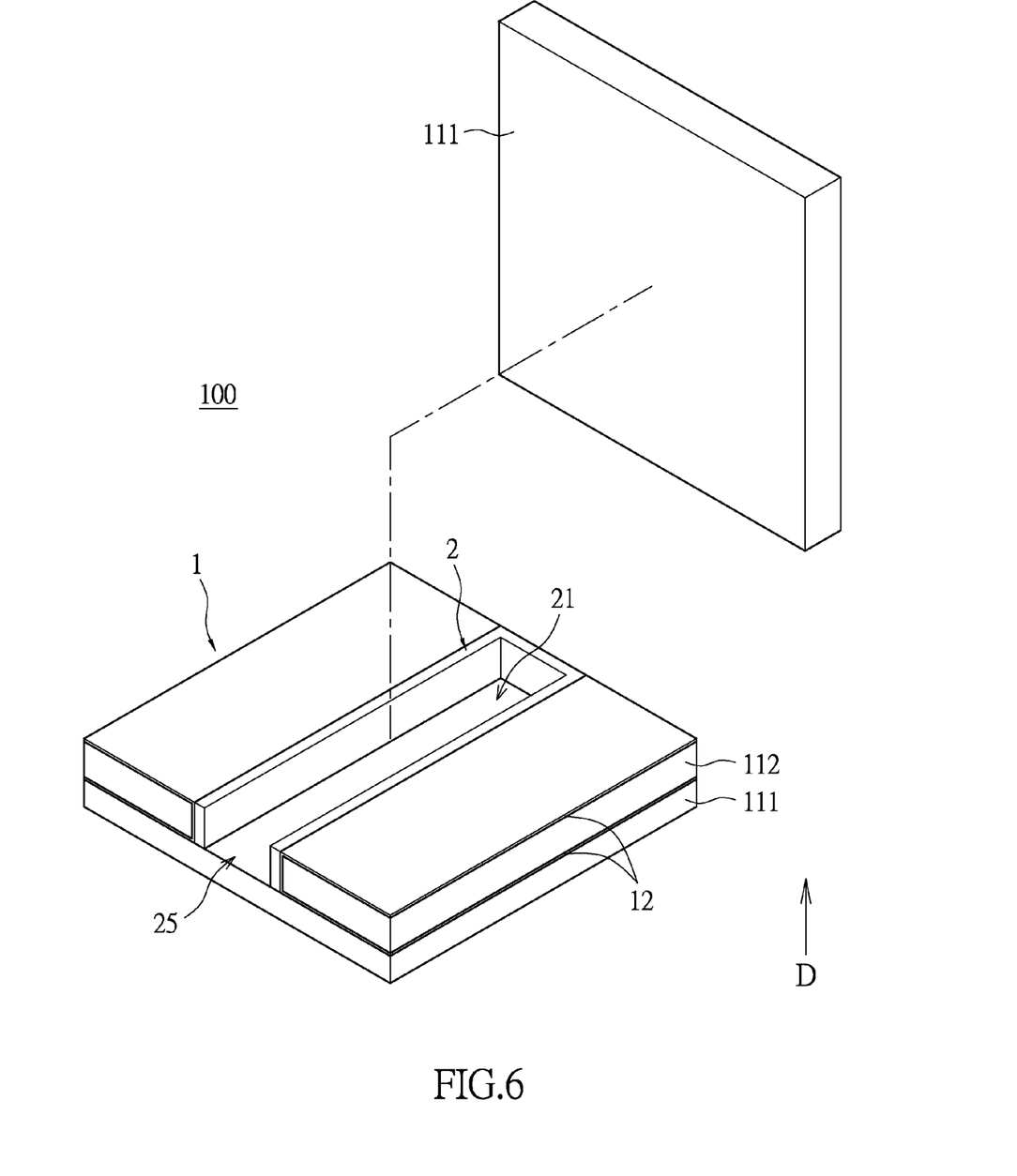
FIG. 6 is a perspective view showing a circuit board with an opening according to the instant disclosure.

The compartmentalized frame 2 as shown in FIG. 2 can be changed as shown in FIG. 6. In more detail, the compartmentalized frame 2 has at least one opening 25 exposed from the multi-layer structure 1. One end of the compartmentalized frame 2 having the opening 25 is substantially arranged coplanar with the outer surface of the multi-layer structure 1, and the predetermined space 21 of the compartmentalized frame 2 is in air communication with the external space outside the multi-layer structure 1 via the opening 25, so that the compartmentalized frame 2 is configured to provide elements such as optical fiber or heat pipe to be inserted into the predetermined space 21 via the opening 25. The compartmentalized frame 2 as shown in FIG. 6 is a pillar having a U-shaped cross-section perpendicular to the stacking direction D.

Figure 7:
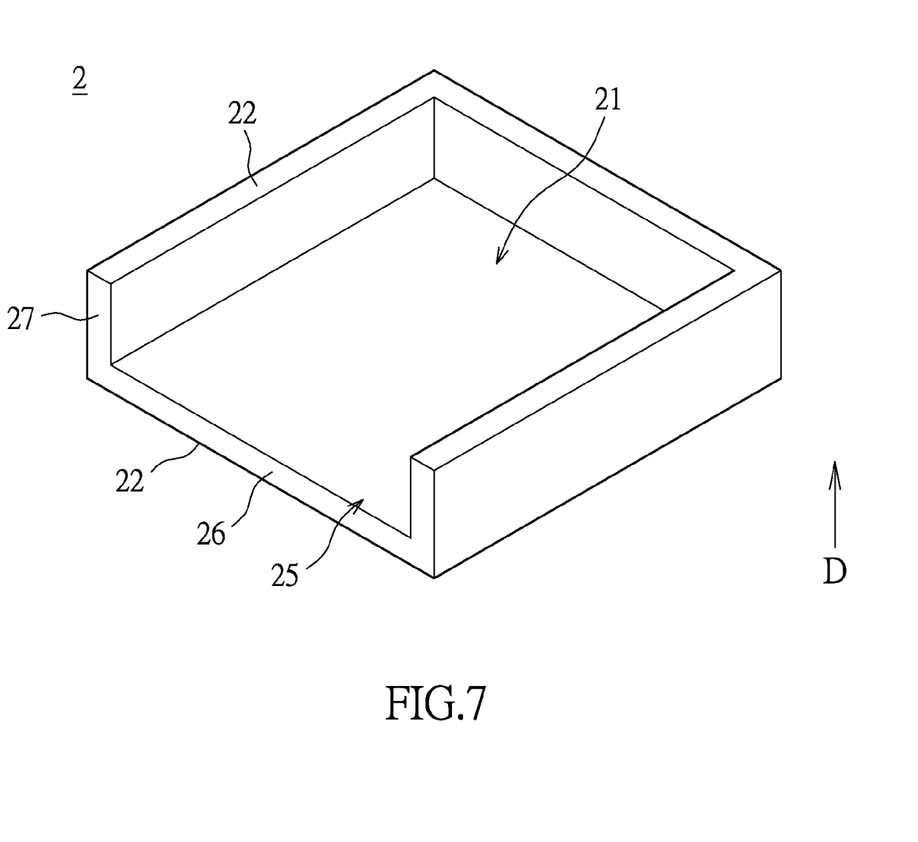
FIG. 7 is a perspective view showing another construction of the compartmentalized frame according to the instant disclosure.

The compartmentalized frame 2 can be formed as shown in FIG. 7. In more detail, the compartmentalized frame 2 has an end plate 26 and a lateral plate 27 integrally extended from peripheral portions of the end plate 26 along the stacking direction D. The lateral plate 27 is a pillar having a U-shaped cross-section perpendicular to the stacking direction D.

The end plate 26 has a face surface arranged away from the lateral plate 27 (i.e., the bottom surface of the end plate 26 as shown in FIG. 7), and the face surface of the end plate 26 is defined as one of the end surfaces 22 of the compartmentalized frame 2. The end surface 22 of the end plate 29 abuts one of the outer plates 111. The opening 25 is jointly defined by the end plate 26 and the ends of the U-shaped lateral plate 27. The opening 25 and the outer surface of the multi-layer structure 1 substantially share a common plane, so that the predetermined space 21 of the compartmentalized frame 2 is in air communication with the external space outside the multi-layer structure 1 via the opening 25.

The compartmentalized frame 2 is formed by metal or ceramic, but the material of the compartmentalized frame 2 is not limited thereto. For example, the material of the compartmentalized frame 2 can be substantially identical to the material of the multi-layer structure 1. That is to say, the compartmentalized frame 2 can be formed by stacking a plurality of plates.

Figure 8:
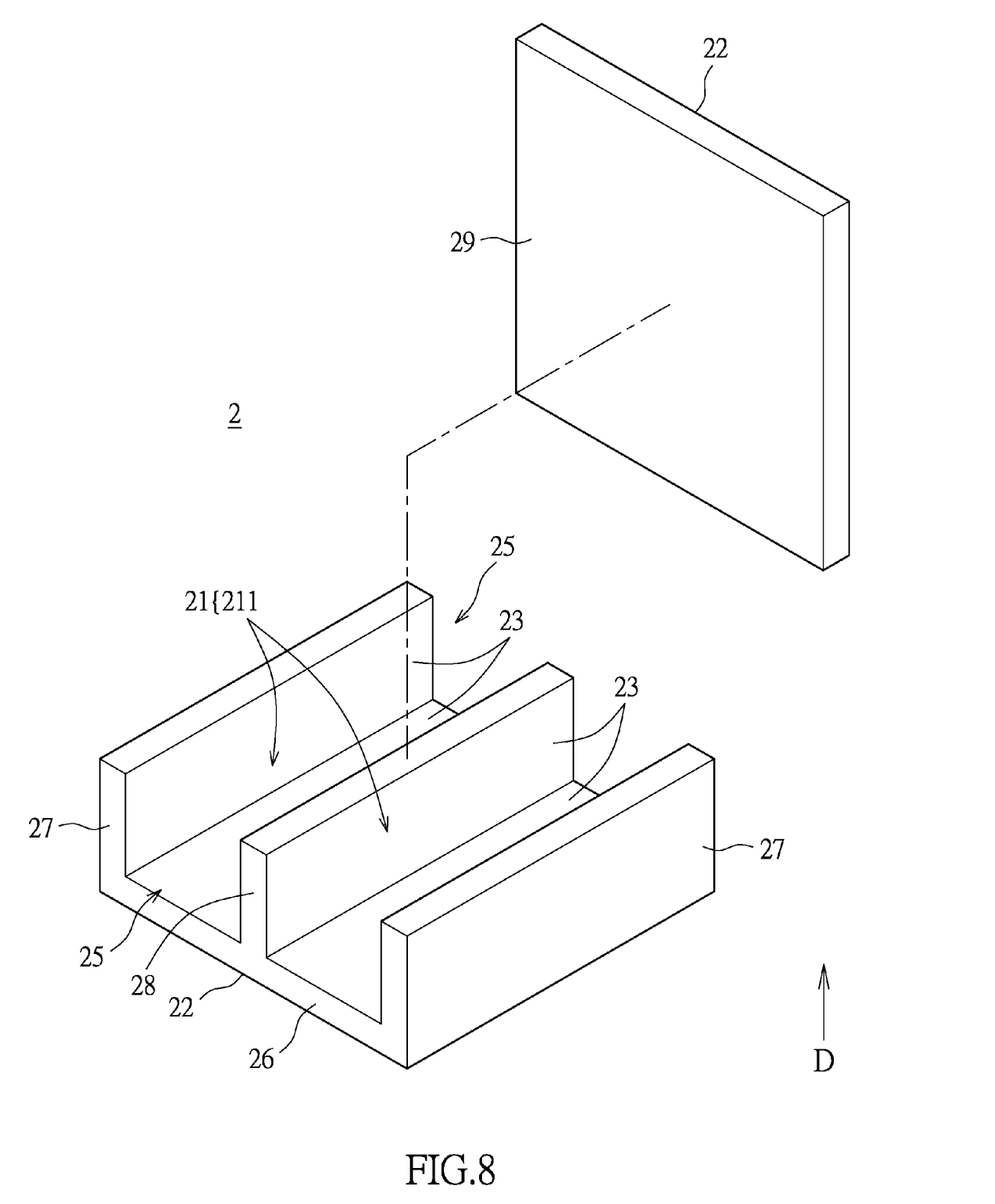
FIG. 8 is a perspective view showing yet another construction of the compartmentalized frame according to the instant disclosure.

Please refer to FIG. 8. The compartmentalized frame 2 has an end plate 26, two lateral plates 27 integrally extended from two opposite portions of the end plate 26 along the stacking direction D, a separating plate 28 arranged between the lateral plates 27 and integrally extended from the end plate 26 along the stacking direction D, and a covering plate 29. The height of each lateral plate 27 along the stacking direction D is identical to the height of the separating plate 28 along the stacking direction D. The end plate 26, the lateral plates 27, and the separating plate 28 jointly form an E-shaped cross-section. The covering plate 29 is fixed on (i.e., adhered to) one end of each lateral plate 27 and one end of the separating plate 28 distal from the end plate 26.

Specifically, the predetermined space 21 of the compartmentalized frame 2 is divided into two elongated sub-spaces 211 by the separating plate 28, and the compartmentalized frame 2 has four openings 25 in air communication with the predetermined space 21. In other words, each sub-space 211 is in air communication with two openings 25 at two opposite sides thereof.

The face surface of the end plate 26 and the face surface of the covering plate 29 arranged away from each other (i.e., the bottom surface of the end plate 26 and the top surface of the covering plate 29 as shown in FIG. 8) are defined as the two end surfaces 22 of the compartmentalized frame 2. The end surfaces 22 respectively abut the outer plates 111. The face surfaces of the lateral plates 27 arranged away from each other (i.e., the left surface of the left lateral plate 27 and the right surface of the right lateral plate 27 as shown in FIG. 8) are arranged adjacent to the wall 1121 of the inner plate 112. The predetermined space 21 of the compartmentalized frame 2 is in air communication with the external space outside the multi-layer structure 1 via the openings 25.

Besides, the separating plate 28 further prevents the covering plate 29 from deforming toward the end plate 26 during the laminated process of the circuit board 100.

Figure 9:
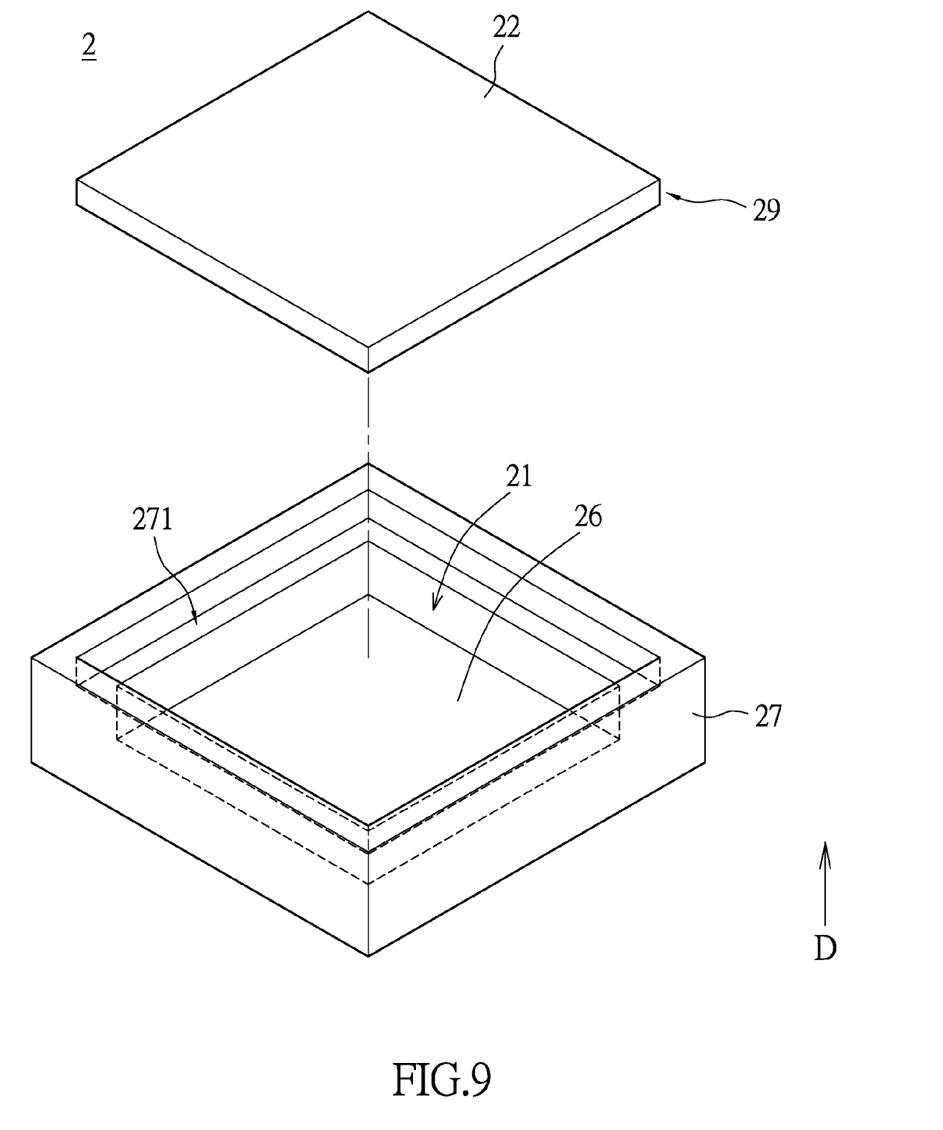
FIG. 9 is a perspective view showing further still another construction of the compartmentalized frame according to the instant disclosure.

Please refer to FIG. 9. The compartmentalized frame 2 has an end plate 26, a lateral plate 27 integrally extended from the peripheral portions of the end plate 26 along the stacking direction D, and a covering plate 29. The cross-section of the lateral plate 27 perpendicular to the stacking direction D is rectangular or square. One end of the lateral plate 27 away from the end plate 26 has a step structure 271 arranged on inner edges thereof. The covering plate 29 has a hole 291 penetrating through a center portion thereof, and the hole 291 is rectangular or square. The step structure 271 of the lateral plate 27 conforms to the contour of the covering plate 29 for enabling the covering plate 29 to engage with the step structure 271. When the covering plate 29 is assembled on the step structure 271, the end surface 22 of the covering plate 29 and the top surface of the lateral plate 27 are in coplanar arrangement, and the compartmentalized frame 2 is a hollow cube construction. An electrical signal can be transmitted into or out from the compartmentalized frame 2 via the hole 291 of the covering plate 29.

Besides, the hole 291 in FIG. 9 is formed on the covering plate 29 for example, but is not limited thereto. For example, the hole can be formed on the end plate 26 for providing the electrical signal to pass through(not shown).

Moreover, the compartmentalized frame 2 needs to bear a lot of pressure during embedding the compartmentalized frame 2 in the multi-layer structure 1, therefore the compartmentalized frame 2 can be made by high strength material (e.g., the thinning metal with high strength applied for the cell phone) to prevent deformation of the compartmentalized frame 2. However, the material of the compartmentalized frame 2 is not limited thereto.

Specifically, the compartmentalized frame 2 formed by the thinning metal with high strength is preferably an integral construction, that is to say, the compartmentalized frame 2 as shown in FIG. 8 or FIG. 9 is integrally formed in one piece construction, thus effectively improving the strength of the compartmentalized frame 2, but is not limited thereto.

[The Probable Effect of the Above Embodiments]

Base on the above disclosure, the compartmentalized frame is embedded in the multi-layer structure, and is arranged in the path defined by the gel flowing direction toward the predetermined space, and the height of the compartmentalized frame along the stacking direction is substantially identical to the combined height of the inner plate and the gel along the stacking direction, so that when the gel arranged between any two plates flows along the corresponding plate, the flowing gel is obstructed by the compartmentalized frame. Thus, the gel canott flow into the predetermined space of the compartmentalized frame to precisely control the spacing in the interior space of the circuit board.

Moreover, the gap defined between the outer surface of the compartmentalized frame and the wall of the inner plate is filled with the gel to enhance the connection of the compartmentalized frame and the multi-layer structure.

Additionally, the construction of the compartmentalized frame can be changed according to designer's demand for different functions. For example, the compartmentalized frame is provided with the opening, and the predetermined space of the compartmentalized frame is in air communication with the external space outside the multi-layer structure via the opening, so that the compartmentalized frame is configured to adapt elements such as optical fiber or heat pipe) to be inserted into the predetermined space via the opening. Alternatively, the compartmentalized frame is includes the separating plate that divides the predetermined space into two sub-spaces, and the separating plate further prevents the covering plate from deforming toward the end plate during the laminated process of the circuit board.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A circuit board having an interior space, comprising:
a multi-layer structure having a plurality of plates stacked along a stacking direction and a gel combining any two stacked plates; wherein the plates have two outer plates and at least one inner plate arranged between the outer plates; and
a compartmentalized frame defining a predetermined space and embedded in the multi-layer structure; wherein at least part of predetermined space is filled with air, the compartmentalized frame is arranged between the outer plates and has two end surfaces respectively abutted against the outer plates, the compartmentalized frame is arranged in a path of the gel flowing direction towards the predetermined space, and the gel is not arranged in the predetermined space.

2. The circuit board as claimed in claim 1, wherein the inner plate has a wall defining a thru-hole, the compartmentalized frame is substantially arranged in the wall of the inner plate, wherein the compartmentalized frame has an inner surface defining the predetermined space and an outer surface; wherein a gap is defined between the outer surface of the compartmentalized frame and the wall of the inner plate, and the gap is filled with the gel.

3. The circuit board as claimed in claim 2, wherein each portion of the outer surface of the compartmentalized frame adjacent to the outer plates has a cutaway corner, each cutaway corner of the compartmentalized frame is substantially arranged in the path defined by the gel flowing direction toward the predetermined space.

4. The circuit board as claimed in claim 2, wherein the compartmentalized frame has at least one opening arranged thereon exposing the multi-layer structure from the compartmentalized frame, the compartmentalized frame is in air communication with space outside the multi-layer structure via the opening, and the compartmentalized frame is configured to provide an external element to be inserted into the predetermined space via the opening.

5. The circuit board as claimed in claim 4, wherein the compartmentalized frame has an end plate and at least one lateral plate extended from the end plate along the stacking direction, the end plate has a face surface arranged away from the lateral plate, the face surface of the end plate is defined as one of the end surfaces of the compartmentalized frame, the face surface of the end plate abuts one of the outer plates, wherein the opening is cooperatively defined by the end plate and one end of the lateral plate.

6. The circuit board as claimed in claim 2, wherein the compartmentalized frame has an end plate, two lateral plates integrally extended from the end plate along the stacking direction, a separating plate arranged between the lateral plates and integrally extended from the end plate along the stacking direction, and a covering plate; wherein the covering plate is fixed on one end of each lateral plate away from the end plate and one end of the separating plate away from the end plate, a face surface of the end plate and a face surface of the covering plate arranged away from each other are defined as the two end surfaces of the compartmentalized frame.

7. The circuit board as claimed in claim 4, wherein one end of the compartmentalized frame having the opening is substantially arranged coplanar with the outer surface of the multi-layer structure.

8. The circuit board as claimed in claim 1, wherein the compartmentalized frame has two different widths perpendicular to the stacking direction, the number of the inner plate is two, wherein the two inner plates are stacked and corresponds to the two widths of the compartmentalized frame, and the compartmentalized frame is embedded in the walls respectively formed in the stacked inner plates.

9. The circuit board as claimed in claim 1, wherein at least one of the plates of the multi-layer structure is provided with at least one conductive circuit.

10. The circuit board as claimed in claim 1, wherein the compartmentalized frame has a height along the stacking direction, the height is substantially identical to a total height of the inner plate and the gel along the stacking direction.

11. A circuit board having an interior space, comprising:
a multi-layer structure having a plurality of plates stacked along a stacking direction and a gel combining any two stacked plates; wherein the plates have two outer plates and at least one inner plate arranged between the outer plates; and
a compartmentalized frame defining a predetermined space and embedded in the multi-layer structure; wherein at least part of predetermined space is filled with air, the compartmentalized frame is arranged between the outer plates and has two end surfaces respectively abutted against the outer plates, the compartmentalized frame is arranged in a path of the gel flowing direction towards the predetermined space, and the gel is not arranged in the predetermined space,
wherein the compartmentalized frame has an end plate, two lateral plates integrally extended from the end plate along the stacking direction, and a covering plate; wherein the covering plate is fixed on one end of each lateral plate away from the end plate, a face surface of the end plate and a face surface of the covering plate arranged away from each other are defined as the two end surfaces of the compartmentalized frame.

12. A circuit board having an interior space, comprising:
a multi-layer structure having a plurality of plates stacked along a stacking direction and a gel combining any two stacked plates; wherein the plates have two outer plates and at least one inner plate arranged between the outer plates; and
a compartmentalized frame defining a predetermined space and embedded in the multi-layer structure; wherein at least part of predetermined space is filled with air, the compartmentalized frame is arranged between the outer plates and has two end surfaces respectively abutted against the outer plates, the compartmentalized frame is arranged in a path of the gel flowing direction towards the predetermined space, and the gel is not arranged in the predetermined space,
wherein the compartmentalized frame has at least one opening arranged thereon exposing the multi-layer structure from the compartmentalized frame, the compartmentalized frame is in air communication with space outside the multi-layer structure via the opening, and the compartmentalized frame is configured to provide an external element to be inserted into the predetermined space via the opening.

* * * * *